US008803623B2

(12) United States Patent
Phan Le et al.

(10) Patent No.: US 8,803,623 B2
(45) Date of Patent: Aug. 12, 2014

(54) MEMS RESONATOR AND METHOD OF CONTROLLING THE SAME

(75) Inventors: Kim Phan Le, Eindhoven (NL); Peter Gerard Steeneken, Valkenswaard (NL); Jozef Thomas Martinus Van Beek, Rosmalen (NL)

(73) Assignee: NXP, B.V., Eindhoven (NL)

( * ) Notice: Subject to any disclaimer, the term of this patent is extended or adjusted under 35 U.S.C. 154(b) by 54 days.

(21) Appl. No.: 13/446,398

(22) Filed: Apr. 13, 2012

(65) Prior Publication Data
US 2012/0262241 A1  Oct. 18, 2012

(30) Foreign Application Priority Data
Apr. 15, 2011 (EP) .................................... 11162591

(51) Int. Cl.
*H03B 5/32* (2006.01)
*H01L 41/047* (2006.01)
*H03H 9/13* (2006.01)
*H03H 9/52* (2006.01)

(52) U.S. Cl.
USPC ............ 331/154; 310/315; 310/363; 333/186

(58) Field of Classification Search
USPC ......... 29/25.35; 310/311, 314, 315, 321, 341, 310/346, 363; 331/154, 156; 333/186–188
See application file for complete search history.

(56) References Cited

U.S. PATENT DOCUMENTS

| | | | |
|---|---|---|---|
| 6,417,743 B1* | 7/2002 | Mihailovich et al. ....... 333/24 C |
| 6,621,134 B1* | 9/2003 | Zurn ............................. 257/415 |
| 7,382,205 B2* | 6/2008 | Van Beek ...................... 331/154 |
| 7,551,043 B2* | 6/2009 | Nguyen et al. ................ 333/186 |
| 7,616,077 B1* | 11/2009 | Wittwer et al. ............... 333/186 |
| 7,847,649 B2* | 12/2010 | Van Beek et al. ............. 331/154 |
| 2006/0125576 A1 | 6/2006 | Ho et al. |
| 2007/0103258 A1* | 5/2007 | Weinstein et al. ............ 333/186 |
| 2009/0121808 A1* | 5/2009 | Van Beek et al. ............ 333/186 |
| 2010/0308931 A1 | 12/2010 | Rebel et al. |
| 2012/0176207 A1* | 7/2012 | Nguyen et al. ................ 333/186 |

FOREIGN PATENT DOCUMENTS

| | | |
|---|---|---|
| WO | 2007/072408 A2 | 6/2007 |
| WO | 2009/097167 A2 | 8/2009 |

OTHER PUBLICATIONS

Parker, C. B. et al. "Temperature and Thickness Dependent Permittivity of $(Ba,Sr)TiO_3$ Thin Films", Applied Physics Letters, vol. 81, No. 2, pp. 340-42 (Jul. 2002).
Mattila, T. et al. "Micromechanical Bulk Acoustic Wave Resonator", IEEE Ultrasonics Symposium Proc., vol. 1, pp. 945-48 (Oct. 2002).
Lin, Y. et al. "Vibrating Micromechanical Resonators with Solid Dielectric Capacitive Transducer Gaps", IEEE Frequency Control Symposium and Exposition, pp. 128-134 (Aug. 2005).
Chandrahalim, H. et al. "Aqueous Transduction of Poly-Site Disk Resonators", 14th Int'l. IEEE Conf. on Solid-State Sensors, Actuators and Microsystems, pp. 313-316 (Jun. 2007).

(Continued)

*Primary Examiner* — Levi Gannon

(57) ABSTRACT

A MEMS resonator has a component which provides a capacitance associated with the transduction gap which has a temperature-dependent dielectric characteristic, which varies in the same direction (i.e. the slope has the same sign) as the Young's modulus of the material of the resonator versus temperature. This means that the resonant frequency is less dependent on temperature.

14 Claims, 4 Drawing Sheets

(56) References Cited

OTHER PUBLICATIONS

Bahl, G. et al "Model and Observations of Dielectric Charge in Thermally Oxidized Silicon Resonators", J. of Microelectromechanical Systems, vol. 19, No. 1, pp. 162-174 (Feb. 2010).

Safari, A. et al. "Ferroelectric Ceramics : Processing, Properties & Applications", Applications of Ferroelectric Ceramic Materials,37 pgs., retrieved from the Internet at http://www.rci.rutgers.edu/~ecerg/projects/ferroelectric.html (Aug. 24, 2010).

Huang, C. et al "The State-of-the-Art of RF Capacitive Tunable Components (Invited)", IEEE Solid-State and Integrated Circuit Technology (ICSICT), pp. 619-622 (Nov. 2010).

Extended European Search Report for EP Patent Appln. No. 11162591.9 (Sep. 21, 2011).

* cited by examiner

fill...

MEMS RESONATOR AND METHOD OF CONTROLLING THE SAME

CROSS-REFERENCE TO RELATED APPLICATIONS

This application claims the priority under 35 U.S.C. §119 of European patent application no. 11162591.9, filed on Apr. 15, 2011, the contents of which are incorporated by reference herein.

This invention relates to MEMS resonators, for example as used in oscillators, and concerns in particular the problem of temperature drift of the resonator frequency.

MEMS resonators are being intensively studied in many research groups and companies, and products have recently been commercialized. Of particular interest is the use of MEMS resonators to form oscillator circuits. MEMS oscillators offer small size, low cost and potentially high level of integration. These devices are expected to replace bulky and expensive quartz crystals in high-precision oscillators. Such oscillators are widely used in time-keeping and frequency reference applications such as real time clocks, RF modules in mobile phones, devices containing blue-tooth modules, USB modules, and other digital and telecommunication devices, etc.

MEMS oscillators usually comprise a silicon MEMS resonator that provides a fixed resonant frequency, and an external amplifier circuit to maintain the oscillation and to provide a stable output frequency.

The two parts can reside in two separate dies in the same package, or they can be integrated into the same die. The MEMS resonator consists of a silicon mass-spring system, which can be excited into mechanical resonant vibration, and means to sense this vibration and to convert it into an electrical signal. The electrical signal is fed into an amplifier circuit. This circuit basically consists of a gain amplifier and a phase shifter. The output of the amplifier is fed back into the actuation side of the resonator. If the total loop gain is larger than one and the loop phase shift is zero, the oscillation can be maintained within the loop.

There are many kinds of MEMS resonators. The three most popular types of MEMS resonators are electrostatic-capacitive resonators, piezoelectric-capacitive resonators, and electrostatic-piezoresistive resonators. In the above compound names, the first part refers to the actuation method and the second part refers to the detection method.

There are also different vibration mechanisms. Extensional-mode vibration consists of a compression wave in the plane of the material. That is, the physical displacement of the material takes place in directions lying in the same plane as the resonator, alternately stretching and compressing the material. A resonator using this extensional mode, and in which the resonance frequency is determined by a sound wave propagating through the material, is generally known as a bulk acoustic mode resonator. Flexural mode resonators instead rely on bending of a structure in a certain direction.

By way of example, an electrostatically actuated resonator (including capacitive or piezoresistive sensing methods) is shown schematically in FIG. 1. The sensing mechanism (e.g. using capacitive or piezoresistive principles) is not shown.

The resonator consists of a spring 10 (mechanical spring constant $k_m$) and a mass 12 (mass m). One end of the spring 10 is anchored to a fixed substrate 14 by an anchor 15. The rest of the spring and mass is free standing. One edge of the mass faces an electrode 16, which is fixed on the common substrate 14. They are spaced by a transduction gap g.

As the whole resonator preferably should be working in a vacuum or low pressure gas environment to reduce gas damping, the gap is preferably also in vacuum. However a non-conducting solid or liquid can instead be positioned in the gap. To actuate the resonator, a combination of a DC bias voltage $V_{dc}$ and an AC actuation voltage $V_{ac}$ is applied to the electrode: $V_{drive}=V_{dc}+V_{ac}$.

The AC voltage has a frequency of $\omega$: $V_{ac}=V_{ac0}\cos\omega t$. In normal operations, $v_{ac0}\ll V_{dc}$. If the capacitance across the transduction gap is C, and the displacement of the mass is x, the electrostatic force F can be written as:

$$F = \frac{\partial C}{\partial x}\frac{V_{drive}^2}{2} = \frac{\partial C}{\partial x}\frac{V_{dc}^2 + 2V_{dc}v_{ac0}\cos\omega t + v_{ac0}^2\cos^2\omega t}{2} \approx \quad (1)$$

$$\frac{\partial C}{\partial x}\left(\frac{V_{dc}^2}{2} + V_{dc}v_{ac0}\cos\omega t\right)$$

The third term in equation (1) is ignored since $v_{ac0}\ll V_{dc}$. In the final form of equation (1), F has two terms: the first term is not time-dependent and therefore does not contribute to the dynamic actuation of the resonator. The second term actually drives the resonator into resonance when the frequency $\omega$ coincides with the resonant frequency of the device.

Even though the first term does not contribute to the actuation, it does affect the spring and thus modifies the resonant frequency, which will be explained below. The first term of the force can be written as:

$$F_{dc} = \quad (2)$$
$$\frac{1}{2}V_{dc}^2\frac{\partial C}{\partial x} = \frac{1}{2}V_{dc}^2\frac{\varepsilon_0 A}{(g-x)^2} \approx \frac{1}{2}V_{dc}^2\frac{\varepsilon_0 A}{g^2} + V_{dc}^2\frac{\varepsilon_0 A}{g^3}x = \frac{1}{2}V_{dc}^2\frac{\varepsilon_0 A}{g^2} + k_e x$$

in which A is the electrode area and $\varepsilon_0$ is the permittivity of vacuum.

In the above calculation, Taylor's expansion has been used. The formula suggests that the force caused by $V_{dc}$ has two terms: the first term is a constant force and the second term depends on the displacement x, which is similar to the behavior of a spring (Hook's law), with a spring stiffness $k_e$, called the electrical spring stiffness. This electrical spring "softens" the mechanical spring $k_m$, since they act in opposite directions. Thus the effective spring will be: $k_{eff}=k_m-k_e$, and the observed resonant frequency is:

$$f = \frac{1}{2\pi}\sqrt{\frac{k_m - k_e}{m}} \quad (3)$$

This is known as the spring softening effect, which depends on the voltage bias $V_{dc}$. The spring softening effect lowers the mechanical resonant frequency.

The resonators are typically made of silicon material, which has by nature temperature dependence of Young's modulus, which is about −40 to −60 ppm per Kelvin of temperature change. Thus, its resonant frequency (proportional to the square root of Young's modulus) typically drifts about −20 ppm/K to −30 ppm/K, which is called the temperature coefficient of frequency (TCF). For a relatively narrow temperature range, TCF is considered constant (or df/f vs. T curve is linear), but for a large range, the second order needs to be taken into account:

$$df/f\,[ppm] = \frac{10^6[f(T)-f_0]}{f_0} = a_1(T-T_0) + a_2(T-T_0)^2 \quad (4)$$

where T is temperature and $T_0$ is a reference temperature at which the resonant frequency is $f_0$.

It is known for example from US20060125576A1 (and many other technical publications) that the temperature drift can be compensated using a feed-forward method. In this method, the temperature of the resonator can be measured with an external temperature sensor, and a temperature-dependent DC bias voltage is generated with an external circuit, which is fed to the electrode of the resonator to compensate for the frequency drift.

In this way, the frequency of the resonator is tuned with the spring softening effect, since the electrical spring stiffness can be expressed as:

$$k_e = V_{dc}^2 \frac{\varepsilon_0 A}{g^3} \quad (5)$$

The spring softening effect can be tuned by the bias voltage $V_{dc}$, if it can be assumed that the other parameters are fixed.

A disadvantage of this method is that extra circuitry and a temperature sensor are needed to perform the compensation scheme and thus some significant amount of power is used.

According to the invention, there is provided a MEMS resonator comprising a resonator body and an actuation electrode for driving the resonator into a resonant mode, wherein the actuation electrode is separated from the resonator body by a non-conductive gap, such that a gap capacitance is defined between the actuation electrode and the resonator body, wherein the resonator comprises an actuation terminal to which an actuation electrode signal (Vdc+Vac) is applied, wherein a capacitance between the actuation terminal and the resonator body, which includes the gap capacitance, includes a structure having a first dependence of effective dielectric constant with temperature over an operating temperature range of the resonator which is equal in sign to the dependence of the Young's modulus of the material of the resonator body with temperature over said operating temperature range.

This invention is based on the use of a component which provides a capacitance which has a temperature dependence of the (effective) dielectric constant. By "dependence of effective dielectric constant" is meant that the structure behaves as a capacitor with a temperature dependency of its dielectric constant. The structure with the desired temperature dependency can be in series with the gap capacitance or it can be the gap capacitance itself. It provides passive temperature drift compensation.

The structure is situated so that it can be assumed to have the same temperature as the resonator. By providing an effective dielectric constant that is temperature dependent, the spring softening effect compensates (partly or totally) for the temperature dependence of the mechanical spring. Using this method, no extra circuit and power consumption are needed for the compensation.

In one example, the material of the resonator body has a negative slope of Young's modulus versus temperature and the slope of effective dielectric constant versus temperature is also negative over the operating temperature range.

In one example, a dielectric layer is applied to the resonator body or the actuation electrode at least in the vicinity of the non-conductive gap, the material of the dielectric layer having the desired dependence of (effective) dielectric constant with temperature over the operating temperature range of the resonator.

This arrangement makes (at least a part of) the gap capacitance temperature-dependent in the desired manner. The dielectric layer can surround the resonator body or the actuation electrode to avoid the need for patterning.

A first dielectric layer can be applied to the resonator body and a second dielectric layer can be applied to the actuation electrode.

In another example, a capacitor is provided in series between the actuation electrode and the actuation terminal, such that the gap capacitance and capacitor are in series between the input terminal and the resonator body. In this way, the gap capacitance is not altered (and has an air or vacuum dielectric) but an additional capacitor is placed in series. The additional capacitor then comprises a dielectric having the desired dependence of dielectric constant with temperature over the operating temperature range of the resonator.

In another example, a PN junction is provided in series between the actuation electrode and the actuation terminal, such that the gap capacitance and a PN junction capacitance are in series between the actuation terminal and the resonator body, wherein the PN junction capacitance has the desired dependence of effective dielectric constant with temperature over the operating temperature range of the resonator. In this way, the capacitance with desired temperature dependency is not implemented by a capacitor, but is implemented by a different component having electrical properties giving the desired effective capacitor electrical function.

The resonator body preferably comprises silicon, which is known to suffer from temperature dependency of the Young's modulus.

In all cases, the slope of an electrical spring stiffness with temperature is equal in sign to the slope of a mechanical spring stiffness of the resonator structure with temperature, over the operating temperature range of the application, wherein the electrical spring stiffness is defined by:

$$k_e = V_{dc}^2 \frac{\varepsilon_0 A}{g^3}$$

wherein $V_{dc}$ is the applied dc level of the actuation voltage, g is the effective gap distance, A is the effective actuation electrode area at the gap and $\varepsilon_0$ is the effective permittivity of the capacitor dielectric between the actuation terminal and the resonator body.

The resonant frequency is a function of the difference between the two spring stiffness values, so variations are reduced by arranging the variations with the same slope direction.

The term "effective" permittivity and gap distance is used to denote that the overall capacitor function is made of contributions from multiple components, each of which can have their own gap dimensions, permittivity values and area. The combined electrical capacitor function can then be considered to have the "effective" values of gap permittivity, area and gap distance.

The invention also provides a MEMS oscillator comprising a resonator of the invention, a detection arrangement for detecting the vibration of the resonator mass and generating an electrical output signal derived from the vibration, and an electrical feedback circuit for controlling the signal applied to the actuation electrode based on the electrical output signal.

The invention also provides a method of providing temperature compensation for the temperature dependency of the output of a MEMS resonator, wherein the resonator comprises a resonator body and an actuation electrode for driving the resonator into a resonant mode, wherein the actuation electrode is separated from the resonator body by a non-conductive gap, such that a gap capacitance is defined between the actuation electrode and the resonator body, wherein the method comprises applying an actuation electrode signal to an actuation terminal, and providing a capacitance between the actuation terminal and the resonator body with a dependence of effective dielectric constant with temperature over an operating temperature range of the resonator which is equal in sign to the dependence of the Young's modulus of the material of the resonator body with temperature over said operating temperature range Examples of the invention will now be described in detail with reference to the accompanying drawings, in which:

The invention provides a resonator having a component which provides an overall capacitance associated with the transduction gap which has a temperature-dependent dielectric characteristic. The effect is that the slope of the mechanical spring stiffness (of the spring which supports the resonator mass) can be made to match the slope of the electrical spring stiffness. This results in reduced temperature sensitivity of the resonant frequency.

From equation (3) above, it can be seen that to keep the frequency constant, the change in $k_m$ with temperature should match exactly the change in $k_e$, such that their difference remains constant. The change in $k_e$ can be made by changing $V_{dc}$, as described in US2006/0125576A1.

In one aspect, this invention is based on changing the dielectric constant (or relative permittivity) of a part of the gap using a dielectric material, in such a way that the change in $k_e$ matches the change in $k_m$ at different temperature. In another aspect, a separate component is used to provide the desired temperature dependency of the electrical characteristics, but it can again be considered to effect a temperature dependent capacitor dielectric.

Figure 1:
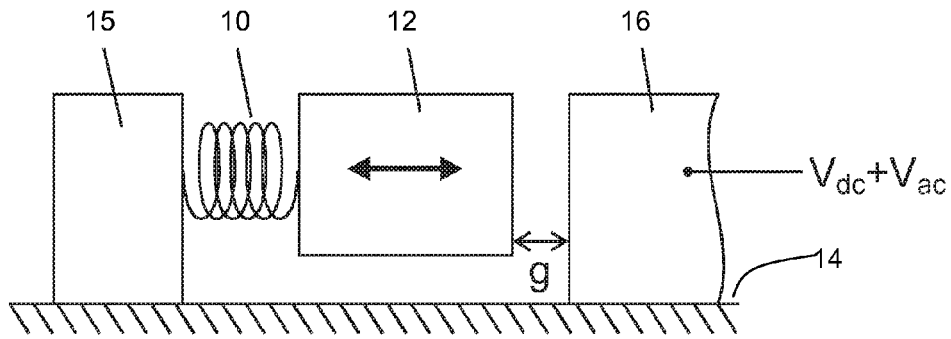
FIG. 1 shows schematically the basic structure of a MEMS resonator.
Figure 2:
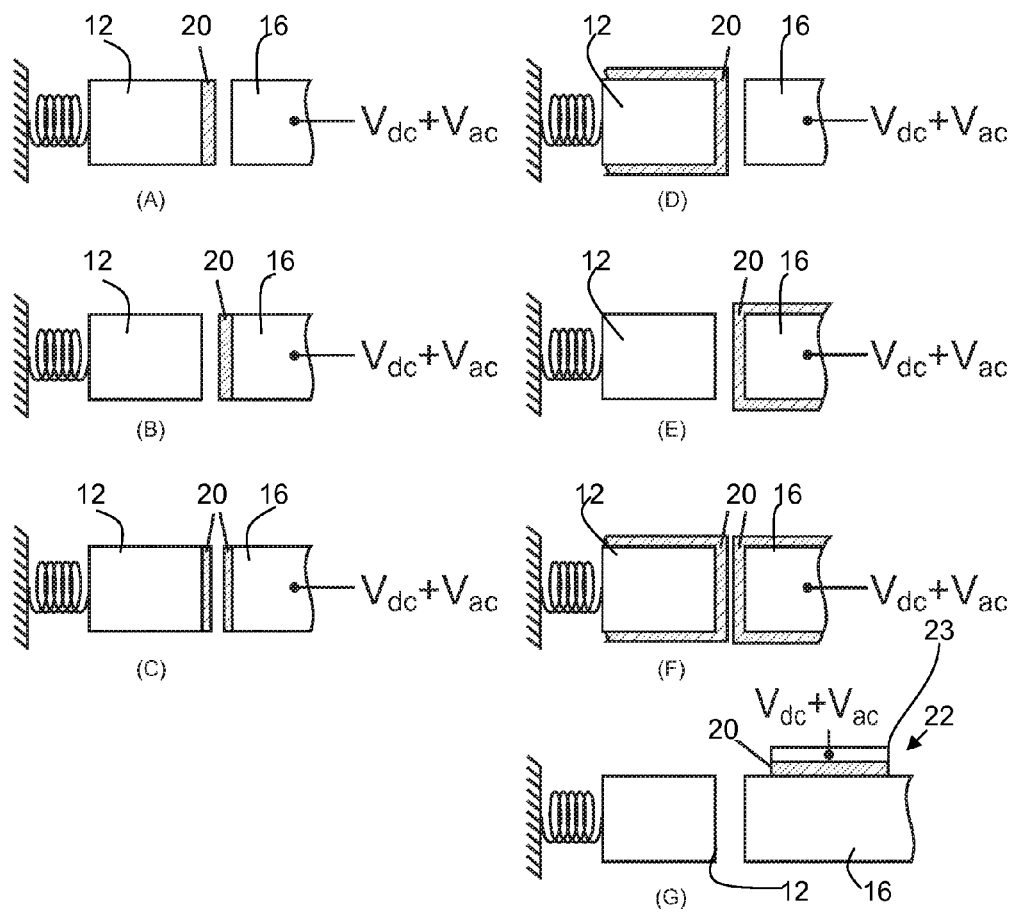
FIG. 2 shows various examples of resonator design of the invention.

FIG. 2 shows various embodiments of the invention. The anchor 15 and the substrate 14 are simplified in FIG. 2 compared to FIG. 1. It should be understood that the plane of the substrate of the MEMS device is in fact perpendicular to the plane of the drawing, as in FIG. 1.

In FIGS. 2A and 2B, a thin layer of dielectric material 20 is deposited on either side of the transduction gap. In FIG. 2A, the dielectric is applied to the resonator mass 12 and in FIG. 2B it is applied to the surface of the actuation electrode 16. The capacitor across the gap can be considered as two capacitors connected in series: the capacitor of the vacuum gap and the capacitor of the dielectric layer.

In FIG. 2C, thin layers of the dielectric material 20 are deposited on both sides of the gap. The thickness of the layers can be the same or different. In this case, the capacitor across the gap can also be considered two capacitors connected in series: the vacuum gap capacitor and the dielectric capacitor which has the total thickness of both dielectric layers.

In FIGS. 2A to 2C the dielectric layer is present only in the vicinity of the gap.

In FIG. 2D, the dielectric layer 20 is shown as coating all around the resonator body. In FIG. 2E, the dielectric layer 20 is shown as coating all around the electrode surface. In FIG. 2F, the dielectric layer 20 is shown as coating all around the resonator body and all around the electrode surface.

In FIG. 2G, a separate dielectric capacitor 22 is placed outside the gap, but as close as possible to the electrode, preferably on the same resonator die. This capacitor 22 is connected in series (by design or interconnection) with the capacitor across the gap. Thus, there are two capacitors in series between an actuation terminal 23 to which the actuation signal is applied and the resonator body 12.

In all cases, the temperature of the dielectric layer or the separate capacitor should be substantially equal to the temperature of the resonator, especially of the spring part of the resonator. This can easily be satisfied for the electrostatic-capacitive resonators since the resonator does not produce heat. However care must be taken in the case of electrostatic-piezoresistive resonators, since a current is set to flow through the device for signal readout, which raises its temperature compared to the electrode and the environment. In this case, it is preferred that the dielectric layer is formed only on the resonator side.

As mentioned earlier, the capacitance C across the electrode is the total capacitance of the vacuum gap and of the dielectric layer (or dielectric capacitor):

$$\frac{1}{C} = \frac{1}{C_{vacuum}} + \frac{1}{C_{dielectric}} = \frac{g_1}{\varepsilon_0 A_1} + \frac{g_2}{\varepsilon_0 \varepsilon_d A_2} = \left(g_1 + \frac{g_2 A_1}{\varepsilon_d A_2}\right)\frac{1}{\varepsilon_0 A_1} = \frac{g_{\mathit{eff}}}{\varepsilon_0 A_1} \tag{6}$$

Here the effective gap:

$$g_{\mathit{eff}} = \left(g_1 + \frac{g_2 A_1}{\varepsilon_d A_2}\right)$$

In the above formulas, $g_1$ and $g_2$ are the thickness of the vacuum gap and the total thickness of dielectric layer(s), respectively. $A_1$ and $A_2$ are the electrode areas of the vacuum capacitor and the dielectric capacitor, respectively. In the examples of FIGS. 2A-2F, $A_1 = A_2 = A$. $\varepsilon_d$ is the dielectric constant of the dielectric layer.

Similar to equation (2), the electrical spring stiffness can be written as:

$$k_e = V_{dc}^2 \frac{\varepsilon_0 A_1}{g_{\mathit{eff}}^3} = V_{dc}^2 \frac{\varepsilon_0 A_1}{\left(g_1 + \frac{g_2 A_1}{\varepsilon_d A_2}\right)^3} \tag{7}$$

It can be seen from equation (7) that if $V_{dc}$, $A_1$, $A_2$, $g_1$, and $g_2$ are supposed to be fixed, the electrical spring stiffness can be change by changing $\varepsilon_d$.

When the temperature increases (for example), due to the temperature dependence of Young's modulus, $k_m$ decreases. In order to compensate for this change, that is, to make $k_e$ decrease, $\in_d$ needs to decrease with temperature as well. If the slope of change in $k_m$ with temperature matches the change in $k_e$, the effective stiffness remains constant and hence the frequency remains constant. This is the principle of the compensation.

The implementation of the invention thus requires the use or engineering of a dielectric material whose dielectric constant has suitable temperature dependence. In particular, the slope is in the same direction as the slope of the Young's modulus of the resonator body material (the spring part in particular), since this is the cause of the temperature dependency of the mechanical spring constant. Besides choosing the right material, there are many tuning parameters such as $V_{dc}$, $A_1$, $A_2$, $g_1$, $g_2$, $k_m$, which can be used to match the two slopes.

Ordinary dielectric materials such as silicon oxide, silicon nitride, etc, have very little temperature dependence. However, there are some classes of dielectric materials (which can be ferroelectric or paraelectric) that have large dependence at some particular temperature ranges. For instance, the ferroelectric ceramics that are widely used in ceramic capacitors and in many other applications may have significant temperature dependence of dielectric constant. The typical dielectric constant of these materials is from hundreds to thousands or higher.

The dielectric constant often exhibits a maximum at a temperature called the Curie temperature (Tc), at which the material transforms from ferroelectric (T<Tc) to paraelectric (T>Tc). The position of the maximum and the slopes on both sides of the maximum can be tuned by material compositions and fabrication conditions. The slope can be up to 2-3 $K^{-1}$ or more.

For capacitor applications, it is desired that the operation temperature is close to Tc where the change of dielectric constant is minimum. However, in the application proposed in accordance with this invention, it is preferred to set the operation temperature range along the negative slope of the dielectric constant vs. temperature curve, to compensate for a resonator material with negative slope of Young's modulus with temperature.

Examples of suitable materials are:

perovskites family, such as CaTiO3, BaTiO3, PbTiO3, BaSrTiO3, PbLaZr titanate, lead magnesium niobate, potassium niobate (KNbO3), potassium sodium niobate (KxNa1-xNbO3), potassium tantalate niobate (K(TaxNb1-x)O3), etc.;

tungsten bronze type compounds, such as KxWO3, PbNb2O6, etc.;

bismuth oxide layer structured ferroelectrics, such as Bi4Ti3O12, PbBi2Nb2O9, etc.;

lithium niobate and tantalite;

organic polymers, such as polyvinylidene fluoride, etc.;

ceramic polymer composites.

These are simply examples of possible materials, but other materials with negative slope of dielectric constant versus temperature can be used.

The dielectric material can be fabricated with many techniques, such as a ceramic process, sol-gel, physical and chemical vapour deposition. For thin films, physical and chemical vapour deposition techniques are more suitable.

Physical vapour deposition techniques (PVD) include: sputtering, evaporation, laser ablation, e-beam deposition. Chemical vapour deposition techniques (CVD) include: Low-pressure CVD (LPCVD), Plasma-Enhanced CVD (PECVD), Atomic Layer Deposition (ALD). CVD techniques are more suitable for cases the thin film examples of FIGS. 2A-2F since they offer better conformity of film coverage, whereas any deposition technique may be used for the separate capacitor example of FIG. 2G.

To make the dielectric layers present only inside the gap, as in the examples of FIGS. 2A-2C, or to form the external capacitor of FIG. 2G, a patterning step is further required.

An embodiment is shown in the following, using a material disclosed in article of C. B. Parker, J.-P. Maria, A. I. Kingon, "Temperature and thickness dependent permittivity of (Ba,Sr)TiO3 thin films", Applied Physics Letters, Vol. 81, Nr 2, pp. 340-342, 2002.

Figure 3:
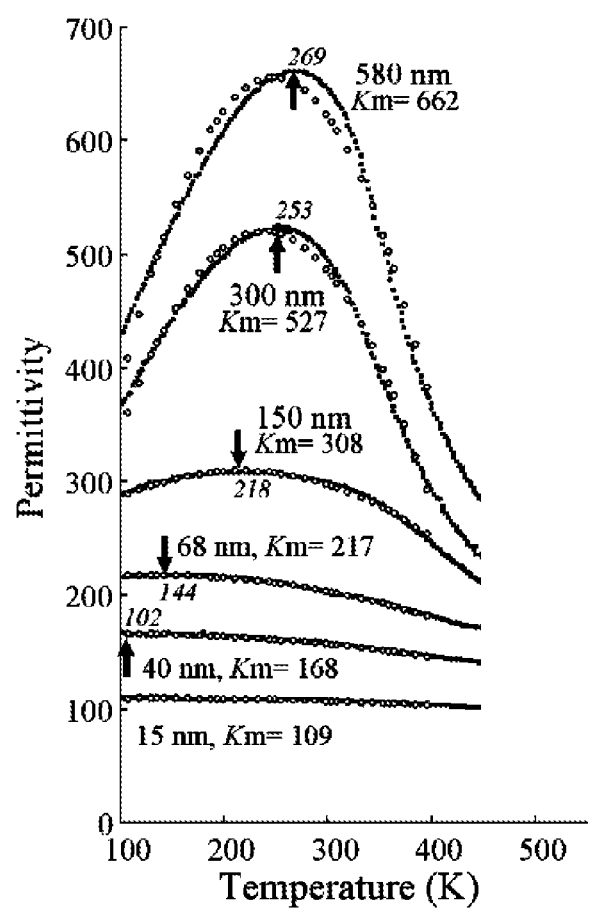
FIG. 3 shows the dependency of the permittivity of one example material on temperature.

When fabricated in the form of thin films, (Ba,Sr)TiO3 material has dielectric constant of about several hundreds, as shown in FIG. 3, which shows the dielectric constant (permittivity) as a function of temperature for six film thicknesses, as disclosed in the paper of Parker et al referred to above.

The maximum permittivity occurs typically below 0° C., and at the temperature range suitable for applications, the dielectric constant (relative permittivity) decreases with temperature, as required by the approach of this invention.

The dielectric layer of thickness 300 nm and the part of the curve to the right side of the maximum are used here for the example.

If this dependence of dielectric constant vs. temperature is substituted into equation (7) and other parameters are set to practical values and optimized, a match in the slopes of $k_m$ and $k_e$ vs. temperature can be found.

Figure 4:
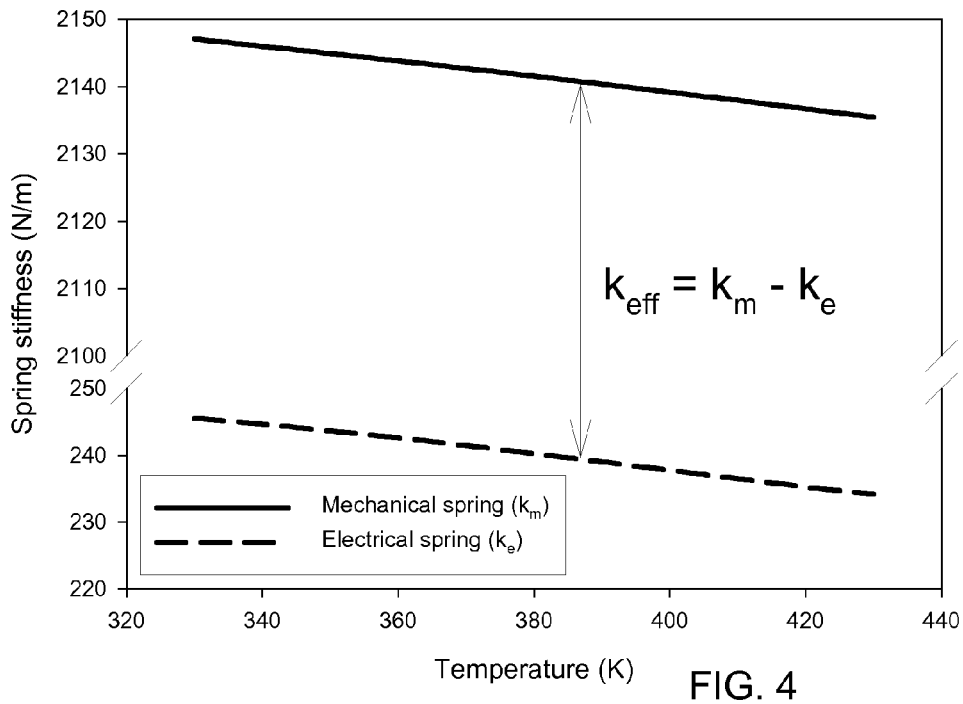
FIG. 4 shows how the material of FIG. 3 can be used to provide a desired electrical stiffness characteristic.

FIG. 4 shows the slopes of the mechanical and electrical springs as a function of temperature. The difference between the two curves is the effective spring stiffness, which is much less dependent on temperature. Thus, the change in the electrical spring at a constant bias voltage $V_{dc}$ vs temperature is matched to the change in the mechanical spring stiffness, resulting in an effective spring stiffness that is much less temperature dependent.

In this calculation, the following parameters are used, for the integral capacitor version of FIGS. 2A to 2F:

$V_{dc}$=2V, $A_1$=$A_2$=$2 \times 10^{-10}$ $m^2$, $g_1$=30 nm, $g_2$=300 nm, $T_0$=300K, $a_1$=−45 ppm/K, $a_2$=−0.056 ppm/$K^2$.

The mechanical spring $k_m$ is tuned by the resonator design so that $k_m$=2150 N/m at $T_0$, which is a practical value for a flexural mode resonator.

Figure 5:
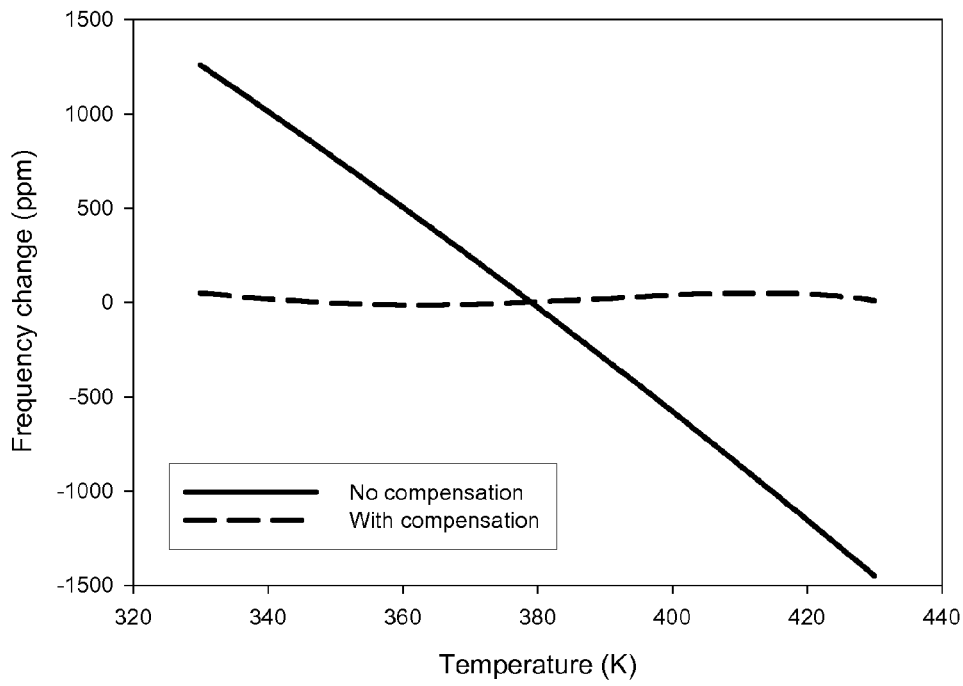
FIG. 5 shows how the material of FIG. 3 gives the desired insensitivity of frequency to temperature when used in an oscillator.

FIG. 5 shows the resulting change in resonant frequency as a function of temperature for two cases: with and without compensation. Without compensation, the change in the resonant frequency is 2700 ppm over 100K range. With compensation as specified in this example, the change can be reduced down to 63 ppm over 100K range, which is a factor of over 40.

Practically, the compensation can not be absolute due to the combination of non-linearities in the temperature dependence of Young's modulus, in the dielectric constant and the non-linear form of equation (7). There is always some small remnant temperature dependence left after compensation as seen by the slightly wavy curve of FIG. 5.

To improve the compensation, the tail of the dielectric constant curve at the high end of temperature where the slope reduces can be exploited. The compensation scheme can be tailored to a particular temperature range, which can then be the same as the operation temperature range in the desired application of the device. In the above example, a guaranteed compensation can be provided in the temperature range 330-340K, which is slightly higher than a normal application range. By optimizing the material (by slightly different compositions and fabrication conditions) to shift the curve to a lower temperature range (for instance with the maximum occurring at ~220K instead of 253K), the temperature range giving optimum compensation performance would be matched to the temperature range suitable for typical applications.

In the above example, a capacitor with a suitable dielectric material is utilized to passively compensate for the temperature drift.

Alternatively, a capacitor made of a PN junction can also be used in series with the transduction gap to serve the same purpose. When the PN junction is reverse-biased, its depletion width is temperature dependent: the depletion width increases with temperature, thus the junction capacitance decreases with temperature.

This has the same trend as using the dielectric material as described above and can be used for temperature drift compensation. The match between the temperature dependence of the capacitance and the spring softening effect can be adjusted by a suitable design of the PN junction and the applied voltage. The PN junction design should minimize leakage current through the PN junction capacitor.

The approach of the invention can be totally passive. The compensation can be built in to the MEMS resonator and thus no extra circuits and power are needed for compensation. A reverse bias voltage applied to a PN junction also does not consume significant power.

The invention can be applied to any resonator circuit, and is of particular interest for MEMS oscillator circuits. These are expected to replace bulky and expensive quartz crystals in high-precision oscillators. The oscillators are widely used in time-keeping and frequency reference applications such as real time clocks, RF modules in mobile phones, devices containing blue-tooth modules, USB modules, and other digital and telecommunication devices, etc.

In a MEMS oscillator circuit, a feedback system provides the actuation voltage, and the feedback loop provides a loop gain which is equal to or larger than 1, and a loop phase of substantially zero. This means that the oscillation frequency, which is the same as the physical resonant frequency of the resonator, is maintained inside the loop.

Figure 6:
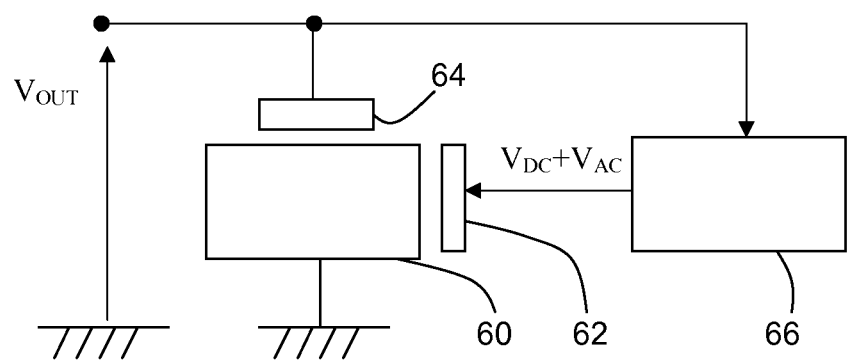
FIG. 6 shows an oscillator design of the invention.

FIG. 6 shows schematically an oscillator circuit, and shows the resonator 60, with the associated actuation electrode 62 and detection electrode 64. The feedback circuitry 66 controls the AC and DC voltages applied to the actuation electrode to maintain the resonant vibrations, and uses as input the detection electrode signal, which may also serves as the electrical output of the oscillator.

The feedback system may use differential or single ended signals. The oscillator circuit is not shown in detail as this is completely routine and is not altered by the application of the invention to the resonator design.

It should also be noted that in some cases it might be favourable to completely eliminate the vacuum gap and to fill the volume between the actuation electrode and the resonator body fully with a dielectric material, which can be a solid or a liquid. The mechanical property of the dielectric material is incorporated into the resonant mode shape of the resonator, with an assumption that there is a close acoustic matching between the bulk resonator and the dielectric layer. Another possibility is to use a material of very low Young's modulus (below 10 MPa) and high dielectric constants ($\in_d > 10$). This material thus has minimum effect on the mechanical properties of the resonator.

The dielectric material and actuation electrode can be part of the resonator body instead of separate components as shown above. This can be the case when the gap is filled with a solid non-conductive material, rather than an air or vacuum gap as in the examples above. In this case, the resonance frequency depends also on the mechanical properties and geometry of the dielectric material and actuation electrode.

The solid dielectric which fills the complete gap of the resonator can be a piezoelectric material (for which the equations are different), but it can also be a standard dielectric material like silicon oxide, silicon nitride for example. The electrostatic force is still generated across this solid gap. However the stiffness of the solid dielectric makes it harder for the resonator to move, so this is preferred for relatively high frequency operation, where amplitudes are smaller.

The temperature compensation works very efficiently for solid gap dielectrics, because the full electrostatic force is proportional to dielectric constant of the dielectric in the gap.

The equation in the absence of a vacuum gap g are even simpler. In this case:

$$k_e(T) = (\in(T)/(\in(T_0)))*k_e(T_0)$$

$\in(T)$ is the temperature dependent dielectric constant of the dielectric solid that fills the gap between actuation electrode and resonator.

Thus, if $k_m(T)/k_m(T_0) = \in(T)/\in(T_0)$ the temperature compensation works best.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A MEMS resonator comprising:
a resonator body made of a material having a Young's modulus;
an actuation electrode configured to drive the resonator into a resonant mode, wherein the actuation electrode is separated from the resonator body by a non-conductive gap, such that a gap capacitance is defined between the actuation electrode and the resonator body; and
an actuation terminal to which an actuation electrode signal is applied, wherein a capacitance between the actuation terminal and the resonator body, which includes the gap capacitance, includes a structure having a first dependence of effective dielectric constant with temperature over an operating temperature range of the MEMS resonator which is equal in sign to a dependence of the Young's modulus of the material of the resonator body with temperature over said operating temperature range.

2. The MEMS resonator as claimed in claim 1, wherein the material of the resonator body has a negative slope of the Young's modulus versus temperature and a negative slope of the effective dielectric constant versus temperature over the operating temperature range.

3. The MEMS resonator as claimed in claim 1, wherein a dielectric layer is applied to the resonator body or the actuation electrode at least in a vicinity of the non-conductive gap, a material of the dielectric layer having the first dependence of the effective dielectric constant with temperature over the operating temperature range of the MEMS resonator.

4. The MEMS resonator as claimed in claim 3, wherein the dielectric layer surrounds one of the resonator body and the actuation electrode.

5. The MEMS resonator as claimed in claim 3, wherein a first dielectric layer is applied to the resonator body and a second dielectric layer is applied to the actuation electrode.

6. The MEMS resonator as claimed in claim 1, further comprising:
   a capacitor in series between the actuation electrode and the actuation terminal, such that the gap capacitance and capacitor are in series between the actuation terminal and the resonator body.

7. The MEMS resonator as claimed in claim 6, wherein the capacitor comprises a dielectric having the first dependence of the dielectric constant with temperature over the operating temperature range of the MEMS resonator.

8. The MEMS resonator as claimed in claim 1, further comprising:
   a PN junction in series between the actuation electrode and the actuation terminal, such that the gap capacitance and a PN junction capacitance are in series between the actuation terminal and the resonator body, wherein the PN junction capacitance has the first dependence of the effective dielectric constant with temperature over the operating temperature range of the MEMS resonator.

9. The MEMS resonator as claimed in claim 1, wherein the resonator body comprises silicon.

10. The MEMS resonator as claimed in claim 1, wherein a slope of an electrical spring stiffness of a resonator structure with temperature is substantially equal to a slope of a mechanical spring stiffness of the resonator structure with temperature, wherein the electrical spring stiffness is defined by:

$$k_e = V_{dc}^2 \frac{\varepsilon_0 A}{g^3}$$

wherein $V_{dc}$ is an applied dc level of an actuation voltage, g is an effective gap distance, A is an effective actuation electrode area at the non-conductive gap, and $\varepsilon_0$ is an effective permittivity of a capacitor dielectric between the actuation terminal and the resonator body.

11. The MEMS resonator as claimed in claim 1, wherein the non-conductive gap between the actuation electrode and the resonator body is filled by one of a solid dielectric material and a liquid dielectric material.

12. The MEMS resonator as claimed in claim 11 where the dielectric material and the actuation electrode are part of the resonator body, such that the resonance frequency depends also on mechanical properties and geometry of the dielectric material and the actuation electrode.

13. A MEMS oscillator comprising:
   the MEMS resonator as claimed in claim 1;
   a detection arrangement configured to detect a vibration of the MEMS resonator and generate an electrical output signal derived from the vibration; and
   an electrical feedback circuit configured to control the signal applied to the actuation electrode based on the electrical output signal.

14. A method of providing temperature compensation for temperature dependency of an output of a MEMS resonator, wherein the MEMS resonator comprises a resonator body made of a material having a Young's modulus, and an actuation electrode for driving the MEMS resonator into a resonant mode, wherein the actuation electrode is separated from the resonator body by a non-conductive gap, such that a gap capacitance is defined between the actuation electrode and the resonator body, wherein the method comprises:
   applying an actuation electrode signal to an actuation terminal; and
   providing a capacitance between the actuation terminal and the resonator body with a dependence of effective dielectric constant with temperature over an operating temperature range of the MEMS resonator which is equal in sign to the dependence of the Young's modulus of the material of the resonator body with temperature over said operating temperature range.

* * * * *